United States Patent [19]

Grabbe et al.

[11] Patent Number: 5,152,695
[45] Date of Patent: Oct. 6, 1992

[54] SURFACE MOUNT ELECTRICAL CONNECTOR

[75] Inventors: Dimitry G. Grabbe, Middletown; Iosif Korsunsky, Harrisburg; Daniel R. Ringler, Elizabethville, all of Pa.

[73] Assignee: AMP Incorporated, Harrisburg, Pa.

[21] Appl. No.: 774,431

[22] Filed: Oct. 10, 1991

[51] Int. Cl.[5] .............................................. H01R 9/09
[52] U.S. Cl. ........................................ 439/71; 439/66; 439/81; 439/83; 439/885
[58] Field of Search ............... 439/66, 71, 78, 81, 439/83, 591, 876, 885–887

[56] References Cited

U.S. PATENT DOCUMENTS 4,026,627 5/1977 Benasutti ........................... 439/886
5,015,191 5/1991 Grabbe et al. ...................... 439/71

Primary Examiner—Paula A. Bradley
Attorney, Agent, or Firm—Allan B. Osborne; Bruce J. Wolstoncroft

[57] ABSTRACT

A connector (10) for electrically connecting a circuit between electronic devices has been disclosed. The connector (10) includes a platform (14, 64, 94, 114) with cantilevered spring arms (22, 62, 92, 112) extending obliquely outwardly therefrom. The spring arms (22, 62, 92, 112) include raised contact surfaces (26, 72, 102, 122) and in one embodiment, the geometry of the arms (22) provide compound wipe during deflection.

7 Claims, 8 Drawing Sheets

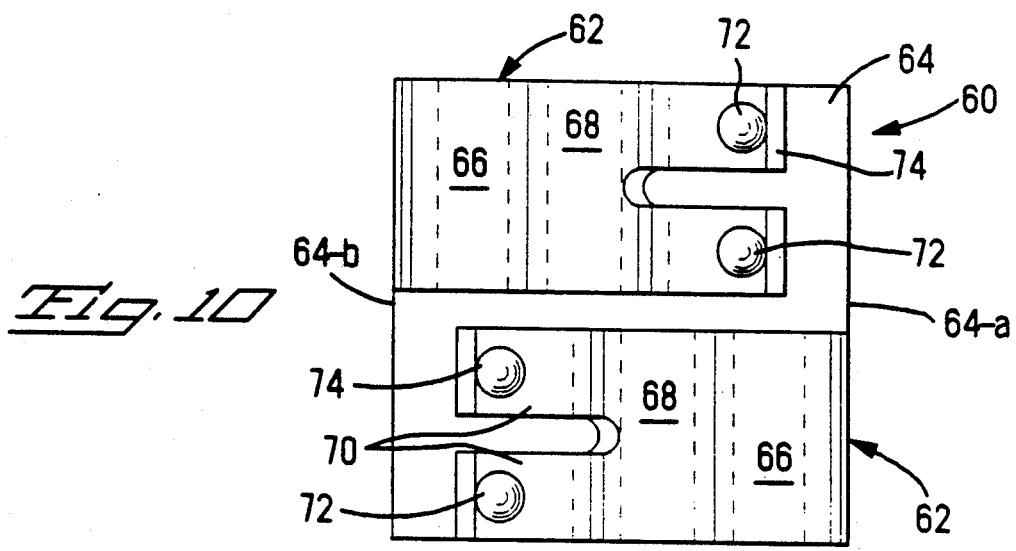
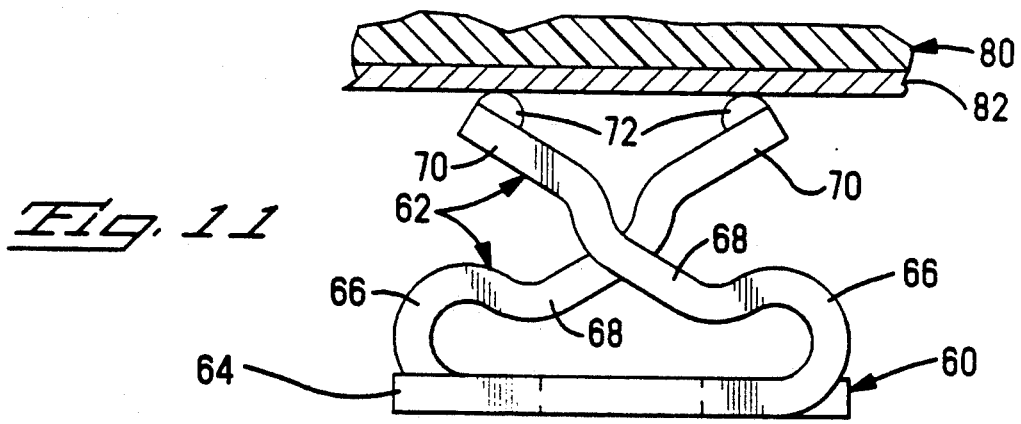
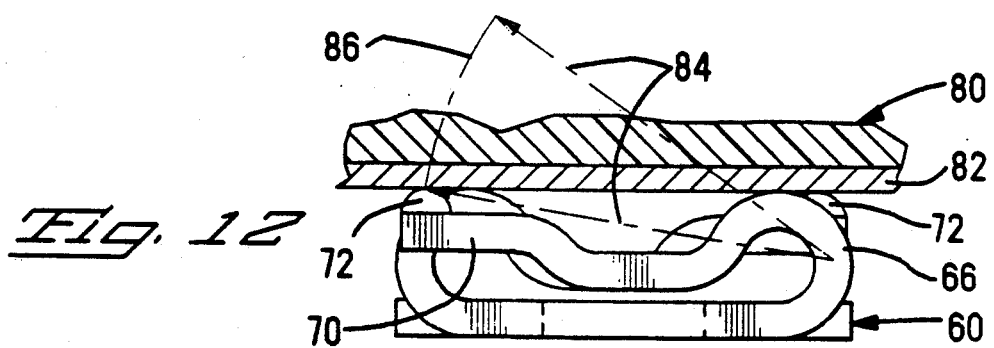

SURFACE MOUNT ELECTRICAL CONNECTOR

FIELD OF THE INVENTION

The invention disclosed herein relates to surface mounted electrical connectors to provide an area array for electronic devices such as multi-chip modules.

BACKGROUND OF THE INVENTION

In efforts to produce extremely high speed computers, the size of the electronic devices used therein has been more and more miniaturized so that now there is a need to provide a means to connect multi-thousand contacts on one millimeter spacing or grid. Further, such a connector must have accurate contact positioning over relatively large areas; e.g., six square inches and possess extremely reliable, transmission line quality signal carrying capabilities. Therefore, it is now proposed to provide an electrical connector capable of being produced in extremely small sizes and having compound contact surface wiping and an enhanced electrical transmission function. It is further proposed to provide area array connections through the use of many of individual connectors of the present invention.

SUMMARY OF THE INVENTION

According to the present invention a connector for electrically connecting two electronic devices is provided wherein cantilevered spring arms extend obliquely outwardly from a platform which is surface mounted on one electronic device. The spring arms have contact surfaces for engaging the second electronic device.

BRIEF DESCRIPTION OF THE DRAWINGS

FIGS. 10 through 18 are views of alternative embodiments of the connector and the deflection of spring arms thereon.

DESCRIPTION OF THE INVENTION

Figure 1:
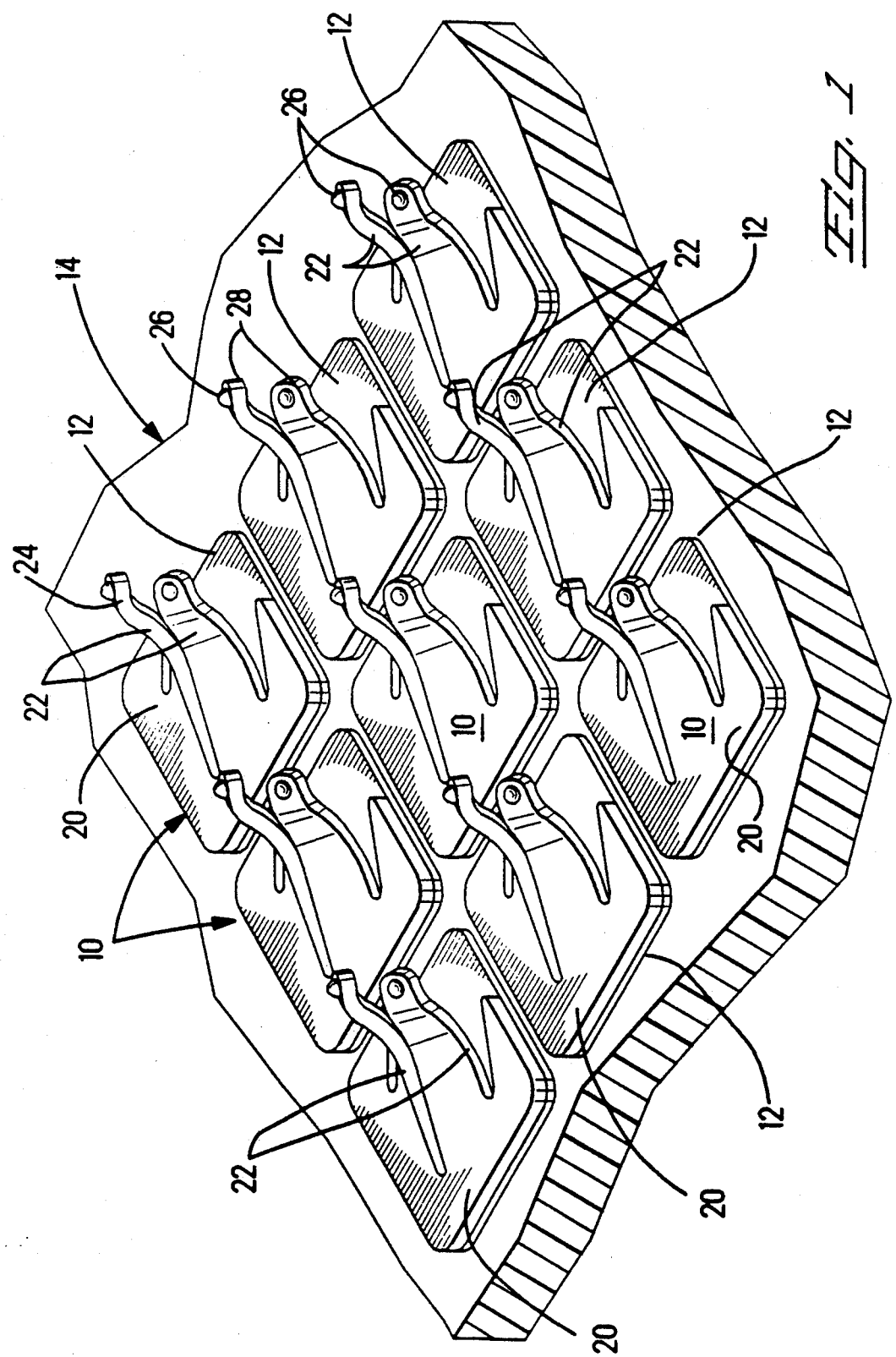
FIG. 1 is a view showing discrete connectors of the present invention mounted on a substrate to electrically interconnect an electronic device thereto.

FIG. 1 shows a plurality of discrete connectors 10 of the present invention soldered to circuit pads 12 forming a specific functional array on substrate 14. Substrate 14 may be a back plane having multiple traces or conductive circuits connecting different arrays of contact pads 12 in a super computer (not shown). Each connector 10 interconnects a single bonding pad on an electronic device (not shown) such as a multi-chip module to a circuit on substrate 14.

A connector 10 includes base or platform 20 and cantilever spring arms 22 extending obliquely outwardly. Platform 20 provides a planar surface for being electrically and mechanically bonded to pad 12 by means such as soldering. Arms 22 have a contact section 24 with a raised contact surface 26 adjacent free end 28 for engaging the aforementioned bonding pad on an electronic device. Contact surface 26 is preferably of a noble metal such as solid gold because of the total absence of porosity therein. Providing such a raised area of gold may be done by bonding on a standard IC wire bonding machine and mechanically profiling to a desired geometry. Alternatively, a gold wire can be percussion welded to the contact section 24, sheared off and coined into the final shape. Other methods may also be used. In one proposed embodiment, connectors 10 are on a one millimeter grid. However, because of the compound wipe provided by the unique structure of spring arms 22, connectors 10 can advantageously be made larger and attached to circuit pads 12 on a much larger spaced grid.

Figure 2:
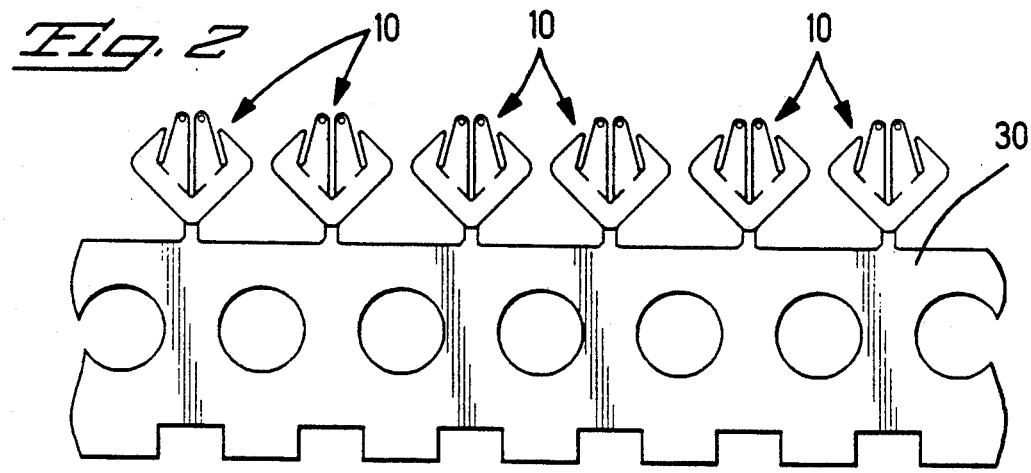
FIG. 2 is a plan view of a strip of the connectors after being contoured but before forming.

Connector 10 may be individually machined or contoured on a continuous carrier strip 30 such as shown in FIG. 2. As is well known, strip 30 can be reeled up for convenient subsequent treatment. One preferred material from which connectors 10 are made is beryllium copper although there are other equally suitable materials.

Figure 3:
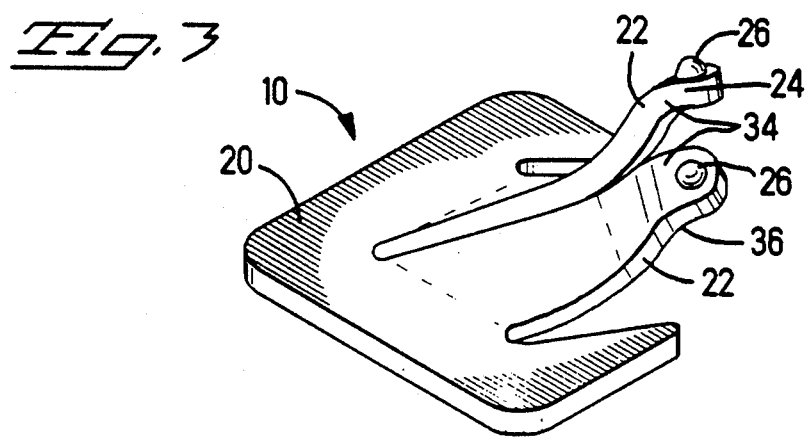
FIGS. 3 and 4 are views of the connector after being formed.

With reference to FIGS. 2 and 3, platform 20 is generally square with spring arms 22 cut out therefrom. For an array having a one millimeter spacing, platform 20 would have a dimension of 0.037 by 0.037 inches (0.09337 by 0.09337 mm).

Spring arms 22 are formed to project obliquely outwardly from platform 20 and further, contact section 34 of arms 22, which includes free ends 28, are twisted away from each other and are also bent back towards platform 20. The point of bending is indicated by reference numeral 36. As will be shown, this structure provides a very desired compound wiping action.

Figure 4:
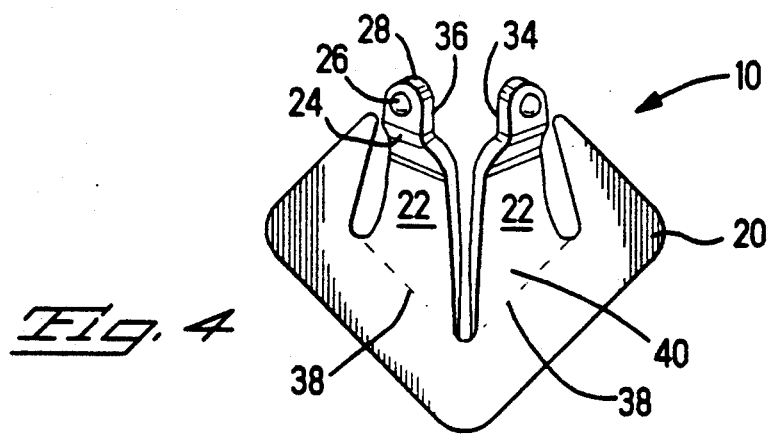

FIG. 4 is also a view of connector 10 but taken from a different angle to illustrate the novel structure of spring arms 22. Lines 38 indicate the hinge point of hinge section 40 of arms 22.

Figure 5:
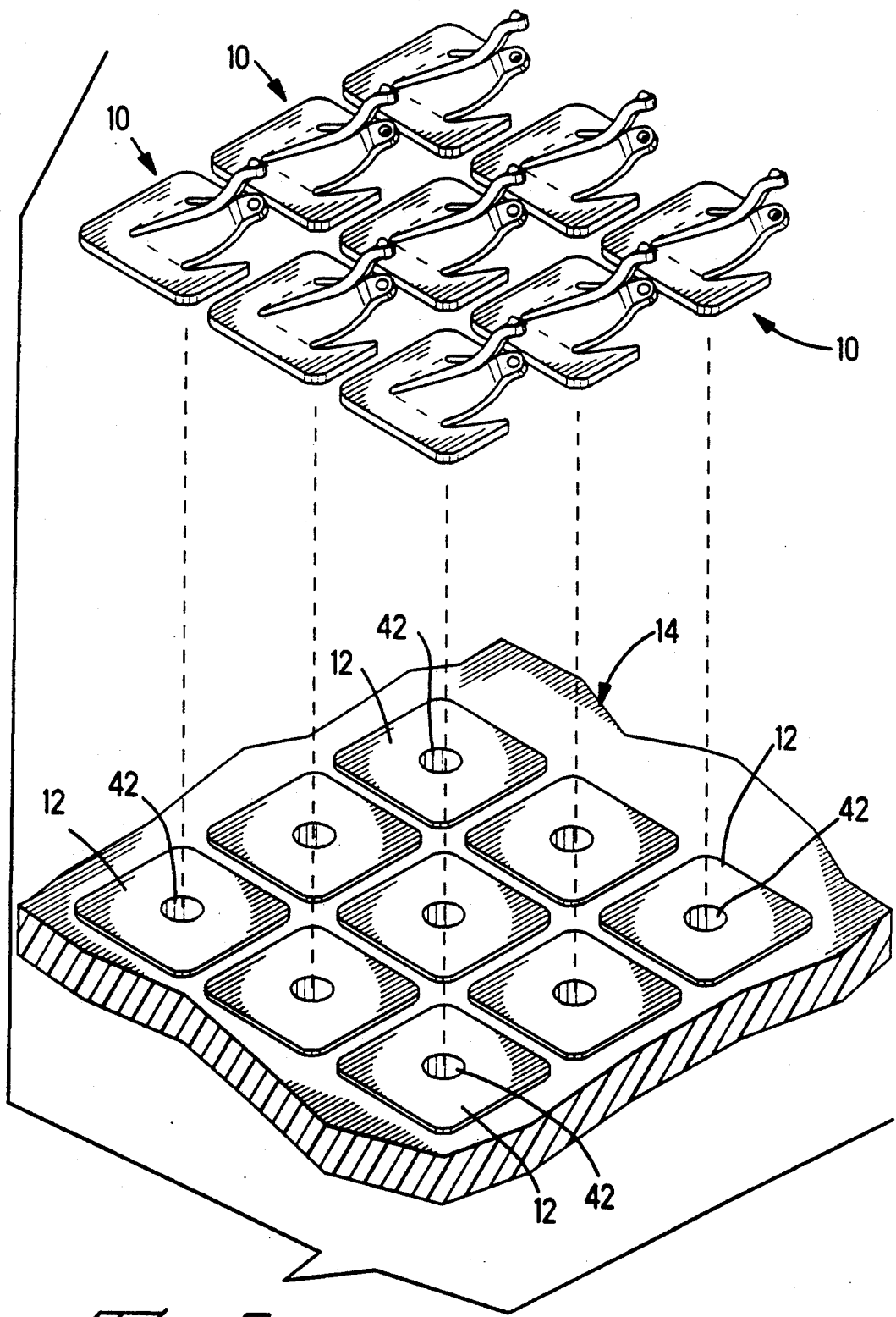
FIG. 5 is a view of the connectors being mounted on a substrate.
Figure 6:
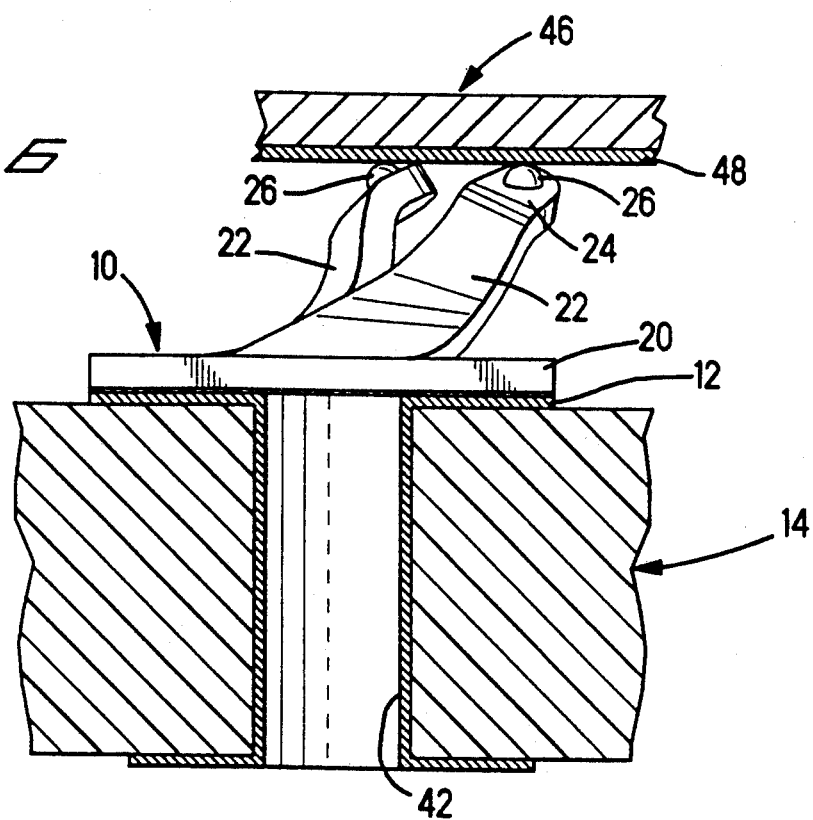
FIGS. 6 and 7 are partly sectioned views showing an electronic device being mounted on the connector.

FIG. 5 shows substrate 14 with an array of circuit pads 12 surrounding vias 42. As is well known, the pad material plates vias 42 and the opposite surrounding surface as shown in FIG. 6. A plurality of connectors 10 shown thereabove are mechanically and electrically attached to pads 12 to form the structure shown in FIG. 1. This step begins with coating the surface of each pad 12 with solder by preferably electroplating or by template printing of solder paste. Connectors 10, carried by strip 30 are positioned on respective pads 12 and soldered by heat pulsing which may be applied by a hot bar method, laser, focused infrared, hot gas, parallel gap reflow or other methods. Strip 30 is then removed to isolate each connector 10. Optionally connectors 10 can be separated from carrier strip 30 prior to soldering.

Figure 7:
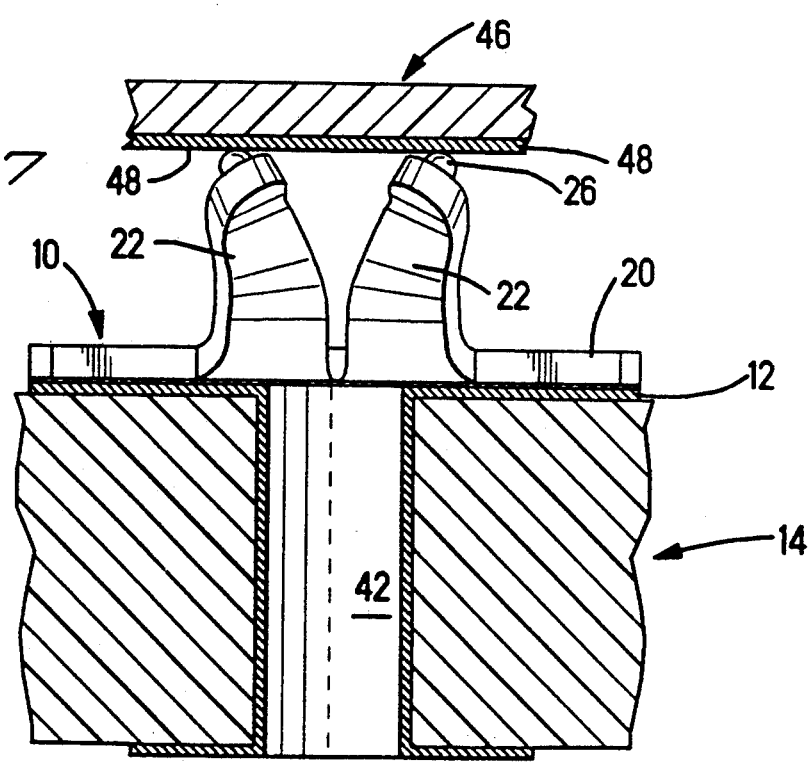

FIGS. 6 and 7 are views taken from different angles showing an electronic device 46 being removably loaded onto a connector 10. Device 46 may include many integrated circuit chips (not shown) and have thousands of bonding pads 48 on extremely close spacing; for example, one millimeter. These two views further illustrate the structure of spring arms 22 which is essentially a uniform radius curvature.

Figure 8:
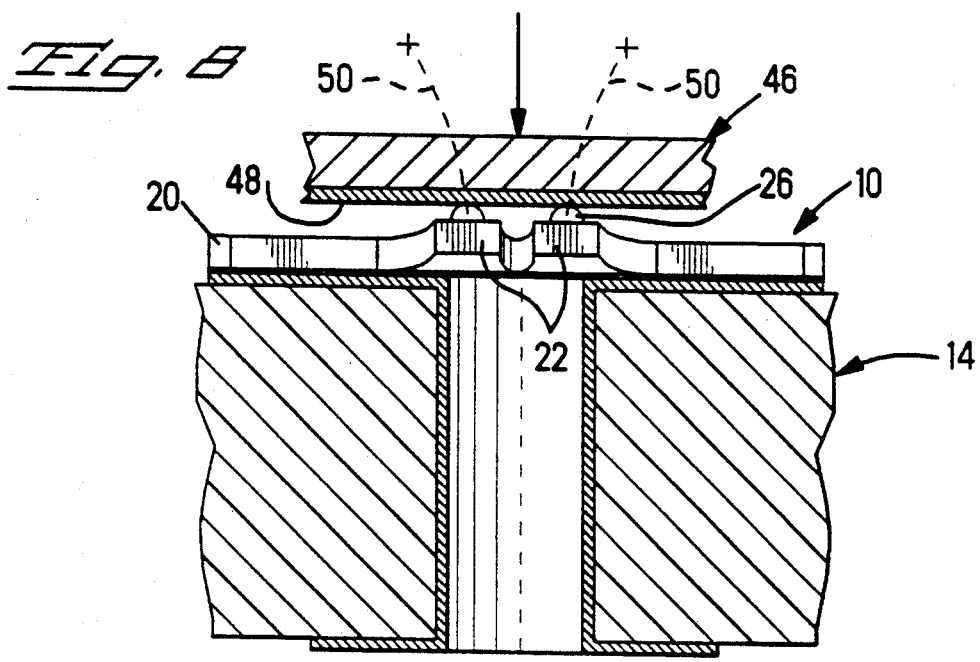
FIGS. 8 and 9 are partly sectioned view showing the electronic device mounted on the connector and the wipe obtained during the mounting.
Figure 9:
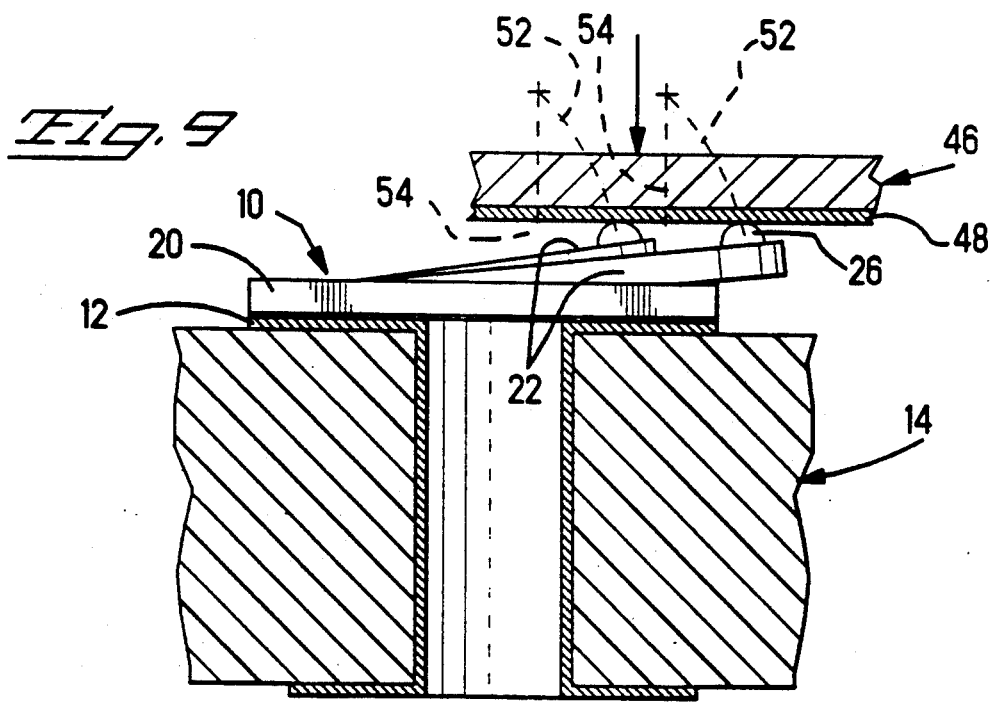

FIGS. 8 and 9 are views which illustrate the compound wipe achieved by spring arms 22 when they are compressed as a load is exerted against device 46. With respect to FIG. 8, the "x"s mark the initial location of raised contact surfaces 26 and the dashed lines 50 show the path taken as arms 22 move towards platform 20. As is shown, arms 22 roll in towards each other causing contact points 26 to move across and wipe pad 48 in that direction.

As shown in FIG. 9, as arms 22 move down in an arc, contact surfaces 26 move from location "x" in a path indicated by dashed lines 52 and thereby wipe across pad 48 for the length between dashed lines 52,54.

The compound wipe obtained by the novel structure of spring arms 22 provides and insures an excellent electrical junction at the points of contact. An even more enhanced electrical junction can be obtained by backing off a deliberate overload to the desired normal force and thereby obtain back wipe.

FIGS. 10-12 illustrate another embodiment of the present invention.

Connector 60 includes two cantilevered spring arms 62 bent out of a base or platform 64 from opposite sides 64-a, 64-b. FIGS. 10 and 11 show that each arm 62 includes a bend or hinge section 66, a jog section 68 and a pair of contact sections 70. Raised contact surface 72 are provided adjacent free ends 74 of sections 70.

Jog sections 68 provide a greater resilient length to arms 62 without increasing the overall linear length.

When a load is imposed on electronic device 80, spring arms 62 bend down with contact surfaces 72 wiping across bonding pads 82. Redundant contact surfaces include the two raised contact surfaces 72 and can include the contact at the hinge section 66 as shown in FIG. 12. Arrows 84 and dashed lines 86 show the arc described by arms 62 as they are deflected downwardly.

The hairpin-like profile of spring arms 62 tends to flatten the force deflection curve substantially.

Further contact sections 70 can also be twisted as are spring arms 22 on connectors 10.

Platform 64 may be ribbed for strength without increasing the thickness of the material.

Figure 13:
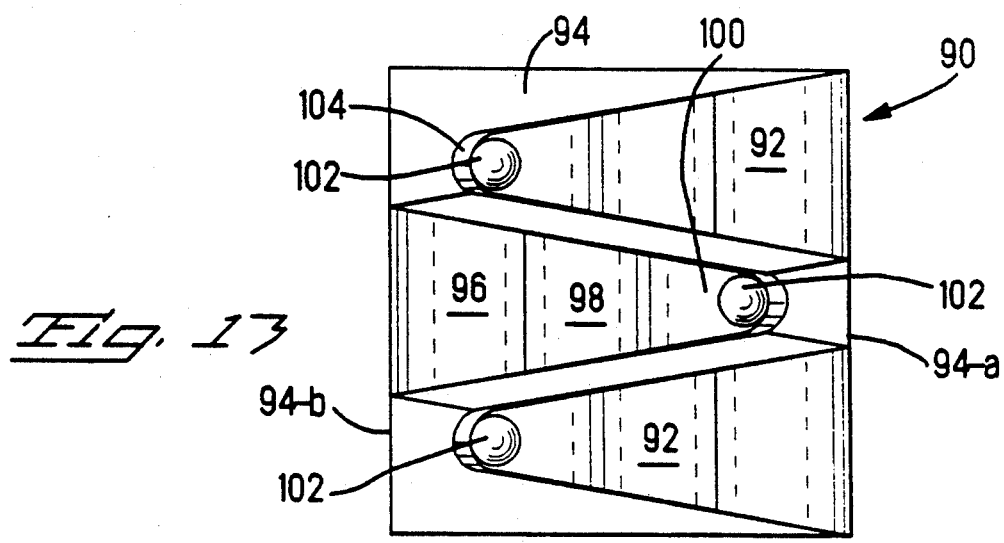
Figure 14:
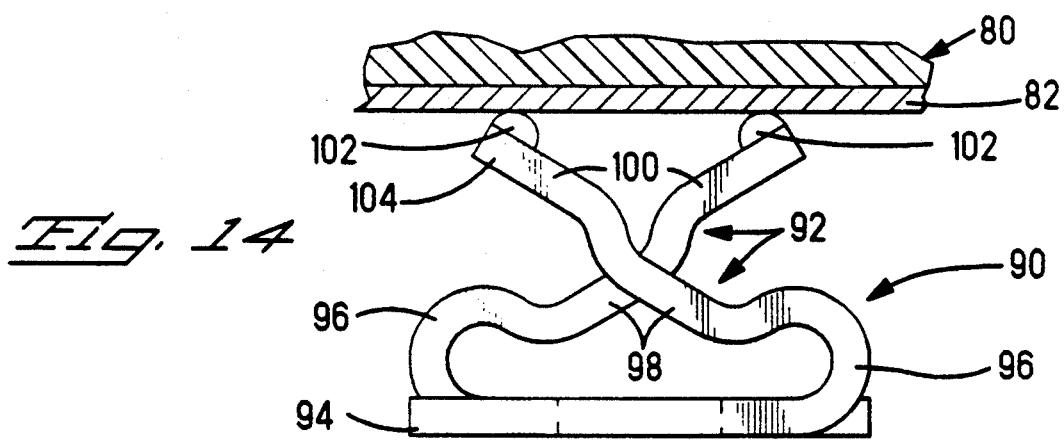
Figure 15:
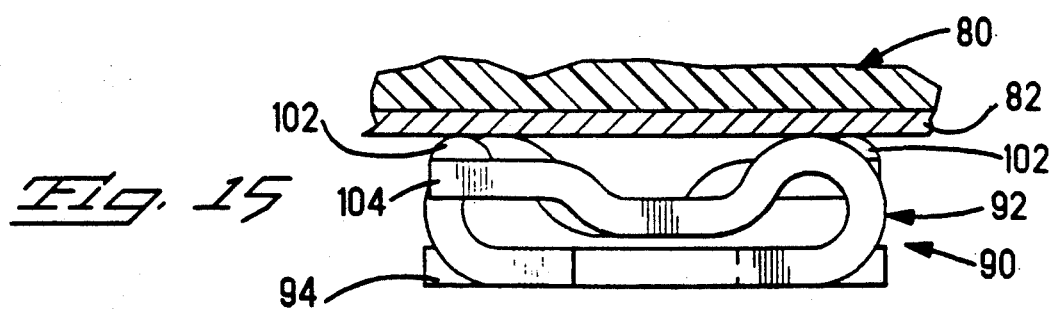

Connector 90, a third embodiment, is shown in FIGS. 13, 14 and 15 and includes three spring arms 92 with two being bent out of platform 94 from side 94-a and one from side 94-b. Arms 92 have the same hairpin-like profile as arms 62 of connector 60; i.e., hinge section 96, jog section 98 but with only one contact section 100. Raised contact surfaces 102 are provided at the free ends 104 of sections 100.

As shown in FIGS. 14 and 15, arms 92 are deflected downwardly in the same manner as arms 62 on connector 60.

Figure 16:
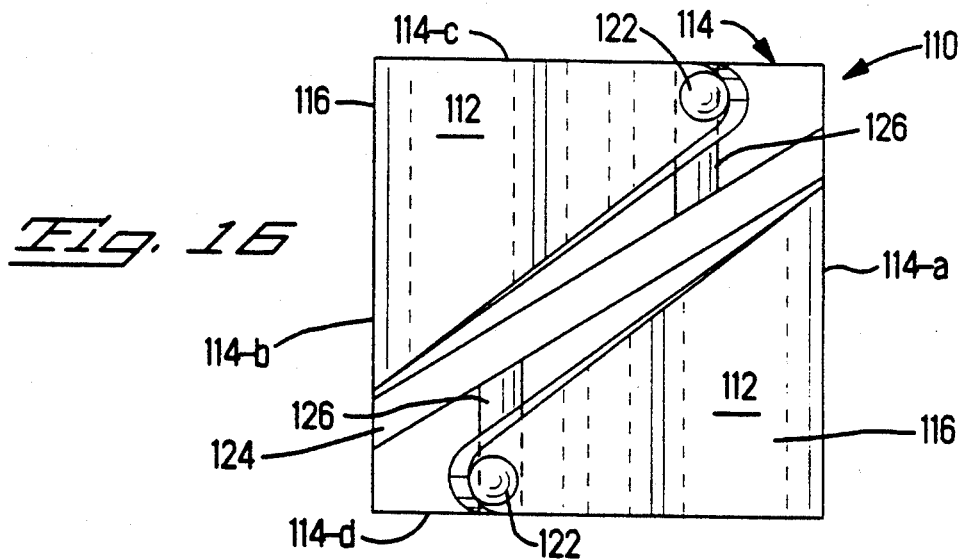
Figure 17:
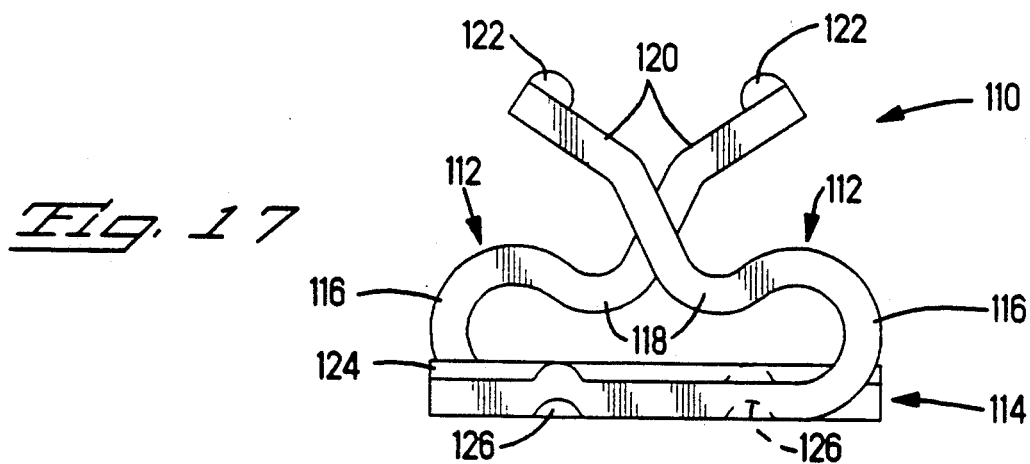
Figure 18:
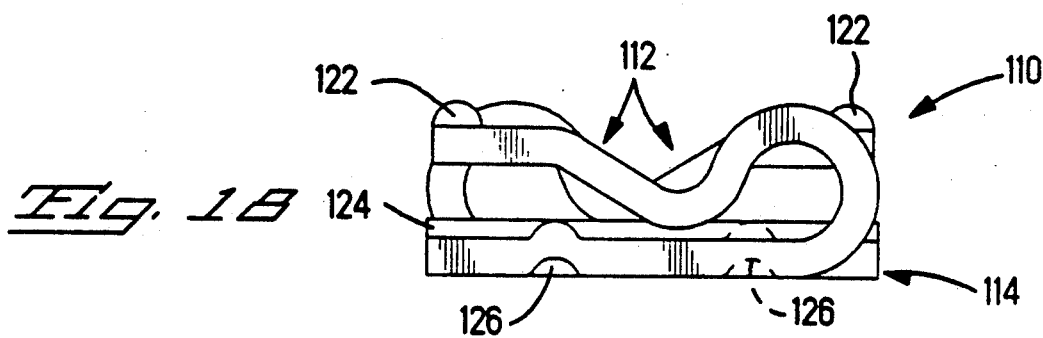

A fourth embodiment is shown in FIGS. 16-18. Connector 110 includes a pair of spring arms 112 which are bent out of opposite sides 114-a, 114-b of platform 114. The sections of arms 112 include hinge section 116, asymmetrical jog section 118 and contact section 120 having a raised contact surface 122.

Besides having an asymmetrical jog section 118, arms 112 asymmetrically narrow outwardly from the attachment to platform 114. The wider hinge section 116 is thus stiffer so that a greater normal force occurs between contact surfaces 122 and bonding pads 82 (FIG. 15).

Rib 124 extend diagonally across platform 114 and ribs 126, parallel to sides 114-a,114-b, extend inwardly from sides 114-c, 114-d to intersect ribs 124.

Arms 112 are deflected downwardly in the same manner as noted with respect to arms 62.

As can be discerned from the above description, a surface mount area array connector, engineered to be made in an extremely small size but also suitable in all sizes, has been disclosed. In one embodiment paired spring arms are formed to provide a compound arc motion which causes an enhanced wipe during the initial mating with bonding pads on an electronic device. The cantilevered spring arms which are structured to limit maximum stress and provide increasing stiffness as they are deflected, extend outwardly from a base or platform which is electrically attached to a circuit substrate or other electronic device. The arms are deflected towards the platform to provide a normal force against the engaging bonding pads.

We claim:

1. A surface mount electrical connector for connecting an electronic device to a circuit on an electronic substrate, comprising platform means adapted for being electrically attached to the bonding area on an electronic substrate, a pair of cantilevered spring arms extending obliquely outwardly from said platform means and having contact surfaces adjacent free ends thereof for engaging a bonding pad on an electronic device, the said free ends of said spring arms being twisted laterally relative to the axis of said arms.

2. A surface mount electrical connector for connecting an electronic substrate to a circuit on an electronic substrate, comprising platform means adapted for being electrically attached to the bonding area on an electronic substrate, a pair of cantilevered spring arms extending obliquely outwardly from said platform means and having contact surfaces adjacent free ends thereof for engaging a bonding pad on an electronic device with said spring arms including a hinge section and a jog section.

3. A connector for electrically connecting an electronic device to a substrate, comprising a connector platform for being electrically and mechanically attached to a conductive location on a substrate, a conductive, elongated, cantilevered resilient means having a raised contact surface thereon and extending outwardly from attachment to said platform, said resilient means adapted to resiliently and removably engage an electronic device with said resilient means including a free end which is twisted laterally relative to the longitudinally axis of said means.

4. A connector for electrically connecting an electronic device to a substrate comprising, a conductive platform for being electrically and mechanically attached to a conductive location on a substrate, a conductive, elongated, cantilevered resilient means having a raised contact surface thereon and extending outwardly from attachment to said platform, said resilient means adapted to resiliently and removably engage in electronic device, the resilient means including a free end which is twisted laterally relative to the longitudinal axis of said means and said free end on said resilient means rolls in as said means are being deflected toward said platform by a force on electronic device engaging said arrays contact surface.

5. A connector for electrically connecting an electronic device to a substrate comprising a conductive platform for being electrically and mechanically attached to a conductive location on a substrate, a conductive, elongated, cantilevered resilient means having a raised contact surface thereon and extending outwardly from attachment to said platform, said resilient means adapted to resiliently and removably engage an electronic device, said resilient means including a plurality of spring arms with said plurality of spring arms extending outwardly from said platform in the disposition generally parallel to each other and with said spring arms including a contact section and said contact sections of the spring arms being twisted laterally away from each other.

6. A plurality of connectors for providing an area array to electrically interconnect bonding pads on two electronic devices, said connectors each comprising, platform means for being electrically and mechanically attached to a bonding pad in one electronic device, cantilevered spring means attached to and extending obliquely away from said platform means, said spring means being adapted to removably and electrically engage a bonding pad on the second electronic device and wherein said cantilevered spring means includes contact sections having raised contact surfaces thereon with said contact surfaces being twisted laterally relative to the axis of said means so that said raised contact surfaces wipe across said bonding pads as said spring means engage the second electronic device.

7. A plurality of connectors for providing an area array to electrically interconnect bonding pads on two electronic devices, said connectors each comprising, platform means for being electrically and mechanically attached to a bonding pad on one electronic device, cantilevered spring means attached to and extending obliquely away from said platform means, said spring means being adapted to removably and electrically engage a bonding pad on the second electronic device and the cantilevered spring means includes contact sections having raised contact surfaces thereon with said contact sections being twisted laterally relative to the axis of said means so that the raised contact surfaces wipe across said bonding pads as the spring means engage the second electronic device and with the contact sections being bent toward said platform means and said raised contact means wipe along said bonding pads as said spring means engage the said second electronic device in a second direction of wipe.

* * * * *

UNITED STATES PATENT AND TRADEMARK OFFICE
CERTIFICATE OF CORRECTION

PATENT NO. : 5,152,695

DATED : October 6, 1992

INVENTOR(S) : Dimitry G. Grabbe, et al.

It is certified that error appears in the above-identified patent and that said Letters Patent is hereby corrected as shown below:

IN THE CLAIMS:

Claim 6, Column 5, Line 9 - replace the word "in" with the word -- on --.

Signed and Sealed this

Twenty-sixth Day of October, 1993

Attest:

BRUCE LEHMAN

Attesting Officer        Commissioner of Patents and Trademarks